US008767780B2

(12) United States Patent
Knap et al.

(10) Patent No.: US 8,767,780 B2
(45) Date of Patent: Jul. 1, 2014

(54) LASER DEVICE FOR EMITTING WAVES IN THE TERAHERTZ RANGE

(75) Inventors: Wojciech Knap, Saint Gely du Fesc (FR); Oleg Klimenko, Moscow (RU); Yuri Mityagin, Moscow (RU); Pierre Solignac, Mudaison (FR)

(73) Assignees: Centre National de la Recherche Scientifique (CNRS), Paris (FR); Universite Montpellier 2 Sciences et Techniques, Montpellier (FR)

( * ) Notice: Subject to any disclaimer, the term of this patent is extended or adjusted under 35 U.S.C. 154(b) by 0 days.

(21) Appl. No.: 14/112,435

(22) PCT Filed: Apr. 19, 2012

(86) PCT No.: PCT/EP2012/057106
§ 371 (c)(1),
(2), (4) Date: Oct. 17, 2013

(87) PCT Pub. No.: WO2012/143410
PCT Pub. Date: Oct. 26, 2012

(65) Prior Publication Data
US 2014/0045700 A1   Feb. 13, 2014

(51) Int. Cl.
*H01S 3/30* (2006.01)
*H01S 3/04* (2006.01)
*H01S 3/097* (2006.01)

(52) U.S. Cl.
USPC .................................. 372/4; 372/35; 372/82

(58) Field of Classification Search
USPC ................................ 372/4, 28, 32, 35, 81, 82
See application file for complete search history.

(56) References Cited

U.S. PATENT DOCUMENTS 5,784,397 A   7/1998   Kim et al.
6,011,810 A   1/2000   Haller et al.

OTHER PUBLICATIONS

Klimenko, O. A. et al., "Terahertz wide range tunable cyclotron resonance p-Ge laser," Journal of Physics: Conference Series, Institute of Physics Publishing, Bristol, GB, vol. 193, No. 1, Nov. 1, 2009, p. 12064, XP020170423, ISSN: 1742-6596.
Chamberlin, D. R. et al: "Narrow linewidth intervalence-band emission from germanium terahertz lasers," Applied Physics Letters, AIP, American Institute of Physics, Melville, NY, US, vol. 83, No. 1, Jul. 7, 2003, pp. 3-5, XP012034985, ISSN: 0003-6951, DOI: 10.1063/1.1590422, p. 1.

*Primary Examiner* — Armando Rodriguez
(74) *Attorney, Agent, or Firm* — Harness, Dickey & Pierce, P.L.C.

(57) ABSTRACT

A laser device for emitting waves in a frequency range belonging to the terahertz range, includes the following, in combination: a wave guide extending longitudinally along an axis A-A'; a superconducting coil arranged coaxially to the wave guide and arranged at a first end of the wave guide; a p-Ge p-doped germanium crystal arranged inside the coil such that the turns of the superconducting coil at least partially surround the p-Ge crystal; a cooling device containing a coolant, the superconducting coil and the p-Ge crystal being arranged in the cooling device, and the wave guide partially extending outside the cooling device; and removing the coolant from the wave guide.

20 Claims, 7 Drawing Sheets

LASER DEVICE FOR EMITTING WAVES IN THE TERAHERTZ RANGE

CROSS-REFERENCE TO RELATED APPLICATIONS

This application is a National Phase Entry of International Application No. PCT/EP2012/057106, filed on Apr. 19, 2012, which claims priority to French Patent Application Serial No. 1153384, filed on Apr. 19, 2011, both of which are incorporated by reference herein.

BACKGROUND AND SUMMARY

The present invention relates to a laser device for emission of waves in the terahertz range. The present invention can have numerous applications. It can apply especially in the fields of medical imaging, security (detection of metals or gases in airports, etc.). It can also enable quality controls.

Sources of terahertz radiation are sources whereof the output signal has a wavelength in the field of far infrared of the electromagnetic spectrum (300 GHz-10 THz). Sources of terahertz radiation are known, such as carcinotrons (or "BWO" for the English expression "Backward Wave Oscillator") or the quantum cascade lasers (or "QCL" for the English expression "Quantum Cascade Laser"). A carcinotron is a tube for generating microwaves which operates by prolonged interaction of an electronic beam and an electromagnetic wave.

A quantum cascade laser is a semiconductor laser capable of emitting a light wave using inter subband transitions in hetero-structures with multiples quantum well. This type of laser theoretically produces quantum yields greater than 1 by "recycling" of carriers. The application of an electrical field allows an electron, once it has emitted a first photon in a first well, to passer by effect tunnel to a following well, and so on. One of the disadvantages of existing sources of terahertz radiation is that they are neither compact nor easy to execute outside a laboratory.

Another disadvantage of existing sources of terahertz radiation is that they do not emit radiation covering all frequencies of the terahertz range. In fact, a carcinotron is capable of emitting radiation in frequencies of less than or equal to 1.5 THz. A quantum cascade laser is as such capable of emitting radiation in frequencies greater than or equal to 2.5 THz. Existing sources of terahertz radiation therefore do not emit radiation in a frequency range between 1.5 THZ and 2.5 THz.

An aim of the present invention is to propose a compact laser device. Another aim of the invention is to propose a laser device capable of emitting a wave in a frequency range between 0.5 THz and 5 THz, and preferably between 1.2 and 2.8 THz.

For this purpose the invention proposes a laser device for wave emission in a frequency range in the terahertz range, comprising in combination:
waveguide extending longitudinally according to an axis A-A', the waveguide comprising a proximal end and a distal end,
a superconducting coil coaxial to the waveguide and arranged at the level of the proximal end of the waveguide,
a p-Ge p-doped germanium crystal arranged inside the coil such that the windings of the superconducting coil at least partially enclose the p-Ge crystal,
cooling means containing coolant in the liquid state, the superconducting coil and the p-Ge crystal being arranged in the cooling means and the waveguide extending partially to the exterior of the cooling means,
means for eliminating coolant in the liquid state in the waveguide, said means comprising two windows transparent to the light radiation in the terahertz range at the level of the proximal and distal ends of the waveguide.

Preferred, though non-limiting, aspects of the device according to the invention are the following:
the means for eliminating coolant in the liquid state in the waveguide replace it with coolant in the gaseous state,
the means for eliminating coolant in the liquid state in the waveguide also comprise a heating element in thermal contact with the waveguide for avoiding coolant condensation,
the means for eliminating coolant in the liquid state in the waveguide comprise a vacuum made in the waveguide,
the windows are made of material transparent in the terahertz range tel such as crystalline quartz, Mylar, Teflon®, crystalline ZnSe, sapphire, high-purity silicon or other high-purity semiconductive crystals,
the window transparent to light radiation positioned at the level of the distal end of the waveguide is a lens,
the device also comprises a resonator comprising at least two mirrors deposited on two respective plates of high-purity germanium crystal in contact with the p-Ge crystal, the p-Ge crystal being arranged between the crystal germanium plates according to the axis A-A' of the waveguide, the mirrors are made of material selected from silicon dioxide $SiO_2$ and high-purity germanium,
the mirror the farthest from the waveguide is spherical,
the device also comprises a convergent lens arranged inside the waveguide such that:
the distance between said lens and the resonator is the greatest possible, and
the light beam originating from the resonator does not come into contact with the internal walls of the waveguide,
the focal distance of the convergent lens is selected such that the light beams exiting from said convergent lens do not come into contact with the walls of the waveguide,
the waveguide comprises a divergent cone trunk and a tube coaxial to the divergent cone trunk, the tube extending at the level of the large base of the cone trunk, the small base of the divergent cone trunk forming the first end of the waveguide,
the superconducting coil comprises at least two layers of windings, each winding of a new layer being positioned in a hollow formed by two adjacent windings of the preceding layer.

BRIEF DESCRIPTION OF THE DRAWINGS

Other characteristics, aims and advantages of the present invention will emerge from the following description which is purely illustrative and non-limiting and must be considered in reference to the attached diagrams, in which.

DETAILED DESCRIPTION

Figure 1:
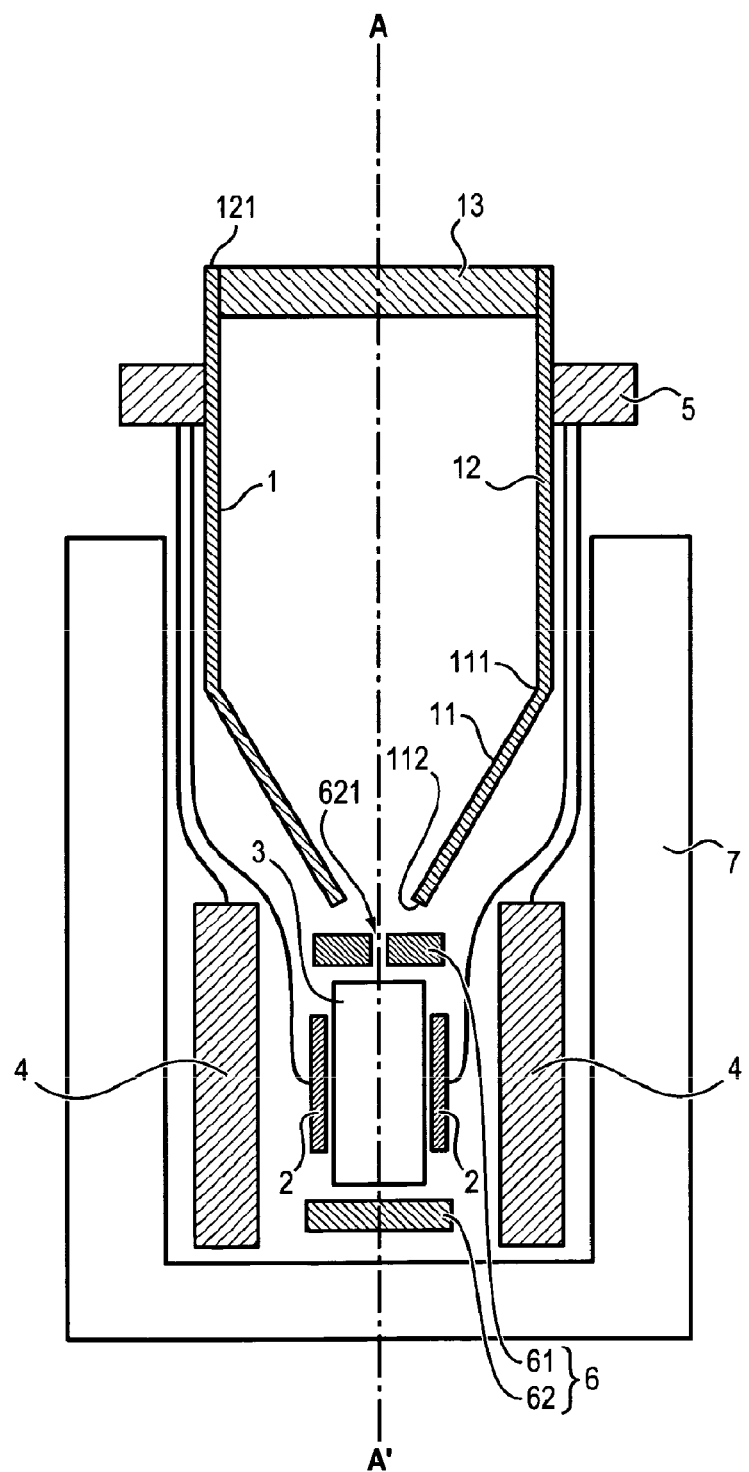
FIG. 1 schematically illustrates an embodiment of a laser device.

An embodiment of the device according to the invention will now be described in greater detail in reference to the figures. In reference to FIG. 1, this illustrates an embodiment of the laser device for wave emission. This laser device is capable of transmitting a light wave in a range of terahertz frequencies by transitions of electrons in the valence band. The laser device comprises a waveguide 1, a support element 2, a p-Ge 3 crystal, a magnetic coil 4, electrically conductive connection means 5, a resonator 6, and cooling means 7.

Waveguide

The waveguide 1 directs the light waves emitted by the p-Ge 3 crystal towards an output of the laser device. The waveguide 1 extends longitudinally according to an axis A-A'. The waveguide 1 is for example made of polished stainless steel. It comprises a proximal end and a distal end. The proximal end is closer to the p-Ge 3 crystal than to the distal end.

In an embodiment illustrated in FIG. 1, the waveguide 1 comprises a divergent cone trunk 11 and a tube 12 coaxial to the divergent cone trunk 11, the tube 12 extending at the level of the large base 111 of the cone trunk 11 (i.e. the base of the cone trunk 11 having the greatest diameter). The free end 121 of the tube 12 forms the outlet of the waveguide 1. The presence of the cone trunk 11 prevents losses in power due to gradual shrinkage of the waveguide 1. The waveguide 1 can comprise a window 13' transparent to the waves emitted in terahertz frequencies, for example made of Teflon® material. This window 13 is arranged at the second end 121 of the waveguide 1.

Figure 6:
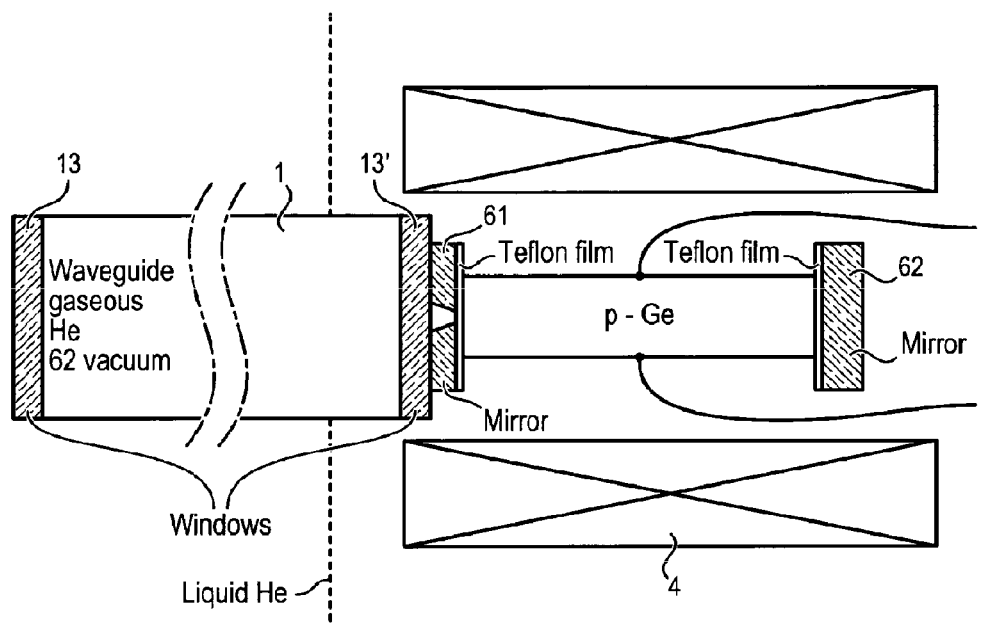
FIG. 6 schematically illustrates means for elimination of coolant of a waveguide.
Figure 7:
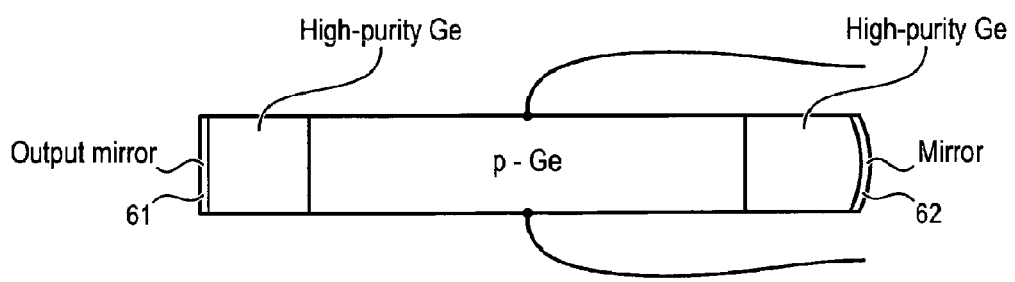
FIG. 7 schematically illustrates a resonator with use of mirrors made of high-purity germanium.

In an embodiment illustrated in FIG. 6, the waveguide comprises means for eliminating coolant in the liquid state contained in the latter. This improves the stability of generation of pulses of the device and limits the risk of power fluctuation from one pulse to the other. In fact, in the event where the waveguide contains coolant in its liquid phase, the latter can be boiled after a pulse, where the heat released by the laser beam is substantial. In this case, the power of the laser beam generated during a second pulse can be different to that of the first pulse, especially due to diffraction of the laser beam on the surface of the liquid coolant when boiling or on the bubbles produced during boiling.

The means for eliminating liquid coolant in the waveguide can comprise two windows transparent to the light radiation in the terahertz range. These windows are for example positioned at the level of the distal and proximal ends of the waveguide. The transparent windows can be stuck to the ends of the waveguide to make the waveguide airtight. In the event where the coolant is helium, an adhesive resistant to helium will be selected.

Advantageously, the resulting airtight waveguide can be filled with coolant in the gaseous state. This eliminates coolant in the liquid state in the waveguide. In this case, a heating element can be provided, in thermal contact with the waveguide for heating the waveguide to keep the coolant contained in the waveguide gaseous.

As a variant, an air vacuum can be created inside the airtight waveguide. This also avoids the presence of coolant in liquid phase.

Support Element

The support element 2 is designed to receive the p-Ge 3 crystal. The support element 2 comprises electrical contacts for generation of an electrical field E through the p-Ge 3 crystal. The support element 2 is connected to a first end 112 of the waveguide. In reference to FIG. 1, the support element 2 is fixed to the small base 112 of the divergent cone 11 (i.e. base of the trunk of cone 11 of smallest diameter).

Magnetic Superconducting Coil

The magnetic superconducting coil 4 generates a magnetic field B perpendicular to the electrical field E. The superconducting coil 4 is coaxial to the waveguide 1. It is arranged at the level of the support element 2. More precisely, the coil 4 is positioned about the p-Ge 3 crystal such that the windings of the coil 4 fully enclose the p-Ge 3 crystal. In other terms, the p-Ge 3 crystal is arranged on the hub of the coil 4 and extends along the axis of revolution A-A' of the superconducting coil 4.

Figure 2A:
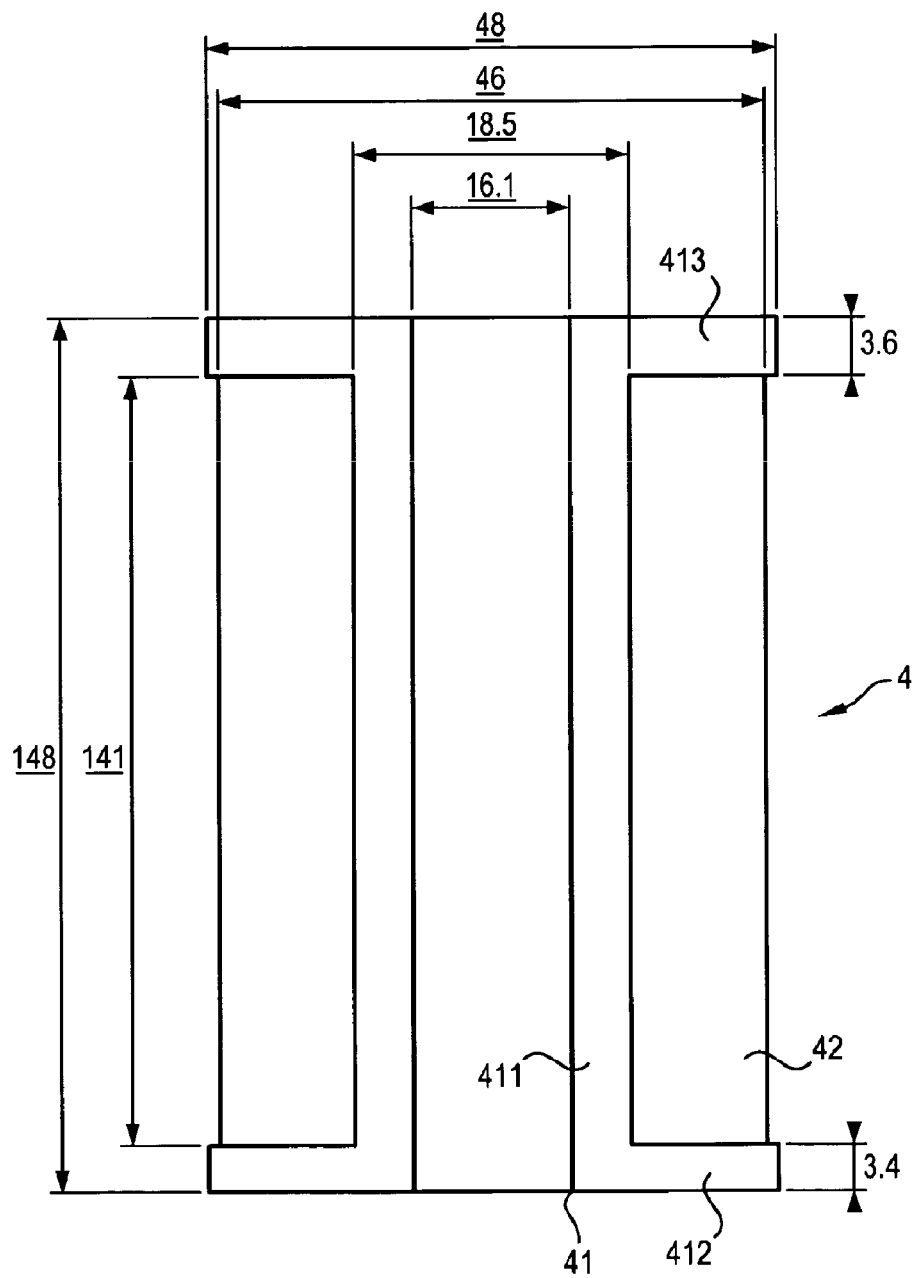
FIG. 2a schematically illustrates an embodiment of a superconducting coil.

An embodiment of the superconducting coil 4 is illustrated in FIG. 2a. The superconducting coil 4 comprises a metal can 41 and a superconducting wire 42 wound about the metal can 41.

The metal can 41 is constituted by a hollow cylindrical core 411 and two flanges 412, 413 at the two ends of the cylindrical core 411. A cylindrical duct of diameter 16.1 mm extends along the axis of revolution of the core 411. The diameter of the duct is provided to allow passage of the support element 2 and the p-Ge 3 crystal (whereof the diameter is of the order of 15.5 mm) inside the metal can 41. The core 411 on which the superconducting wire 42 is designed to be wound up has an external diameter of 18.5 mm and a length of 141 mm.

The superconducting wire 42 has a diameter of 0.33 mm. This wire 42 can comprise a plurality of superconducting filaments. For example, the superconducting wire 42 can comprise 54 filaments, each filament being constituted by Niobium Titanium (NbTi) and being covered by a layer of copper with a ratio of Cu/NbTi=1.3.

The coil 4 comprises a plurality of layers of windings. In the embodiment illustrated in FIG. 2, the coil 4 comprises forty layers of superconducting wire 42, each layer comprising between 402 and 403 windings. The coil 4 also comprises two layers of protection arranged on the forty layers of superconducting wire 42. The wire 42 is rolled up on the metal can 41 according to a so-called "triangle winding" method wherein each winding of a new layer is positioned in a hollow formed by two adjacent windings of the preceding layer. The whole coil 4 is placed in a cylinder of height equal to 148 mm and of diameter equal to 48 mm.

Figure 2B:
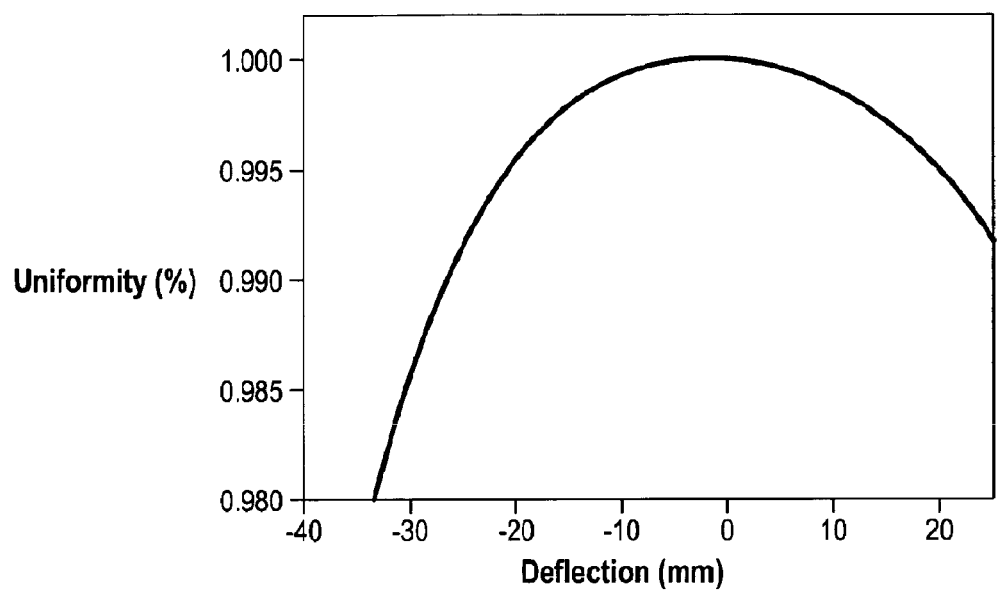
FIG. 2b illustrates the uniformity of the magnetic field generated by the coil illustrated in FIG. 2a as a function of the distance on the hub of the coil.
Figure 2C:
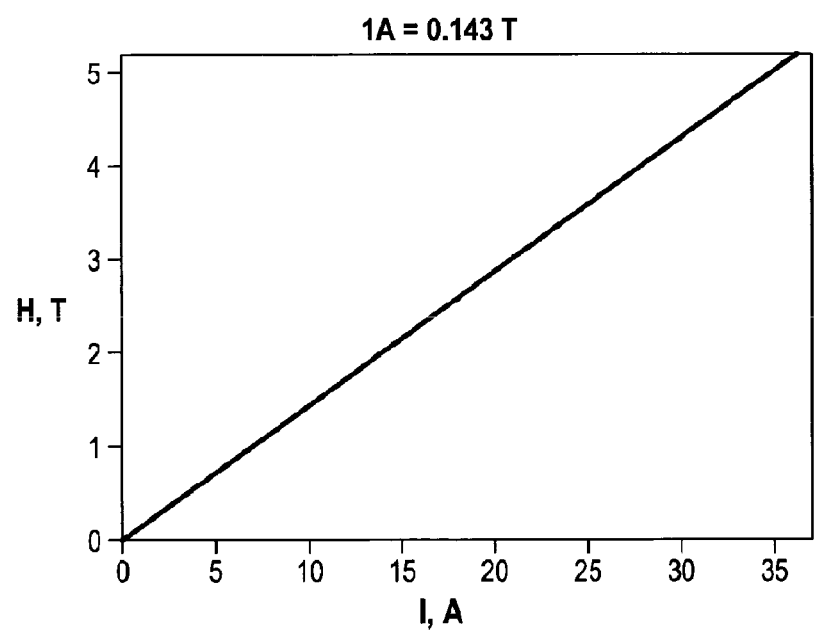
FIG. 2c illustrates the magnetic field generated by the coil illustrated in FIG. 2a as a function of the intensity of the current applied to the coil.

FIGS. 2b and 2c illustrate the principal measured characteristics of the coil 4. FIG. 2b illustrates the uniformity of the magnetic field as a function of the distance at the centre of the coil. FIG. 2c illustrates the value of the magnetic field as a function of the current applied to the coil 4.

p-Ge Crystal

The p-Ge 3 crystal generates a light wave in a terahertz frequency range. The material comprising the p-Ge 3 crystal is p-doped germanium.

The crystallographic orientation of the p-Ge crystal relative to the magnetic B and electrical E fields is selected so as to enable switching of the laser between two radiation regimes:

the inter subband radiation regime (hereinbelow called "ISB", for the English expression "inter subband") and the radiation regime cyclotron resonance (hereinbelow called "CR", for the English "expression cyclotron resonance").

Advantageously, the frequency of the emitted light wave can vary between 1.2 and 2.8 terahertz (40-90 cm$^{-1}$) with a spectral width of less than 6 GHz (0.2 cm$^{-1}$). As described in more detail hereinbelow, this switching between the radiation regime ISB and the radiation regime CR is achieved by making the value and the direction of the magnetic fields B and electrical E vary.

In a p-doped germanium crystal, the application of given electrical E and magnetic B fields allows accumulation of holes in subbands of light divided into Landau levels. Two types of light radiation can be generated as a function of the values and orientations of the electrical field E and of the magnetic field B relative to the crystallographic axes of the crystal.

The first radiation regime—specifically the inter-subband regime (ISB)—is caused by the transition of holes of the valence subbands of light holes (known as "light hole subband") towards the valence subbands of heavy holes (known as "heavy hole subband"). This first radiation mode occurs when:
the magnetic field B is parallel to the crystalline plane [110] of the p-Ge crystal, and
the electrical field E is substantially parallel to the crystalline axis [1-10] in the crystalline plane (110).

The second radiation regime—specifically the cyclotron resonance (CR) regime—is caused by the transition of the holes between the Landau levels and the valence subbands of light holes. This second radiation mode occurs when:
the magnetic field is parallel to the crystalline axis [110], and
the electrical field forms an angle between 50 and 90° with the crystalline axis [1-10] in the crystalline plane (110).

Figure 3:
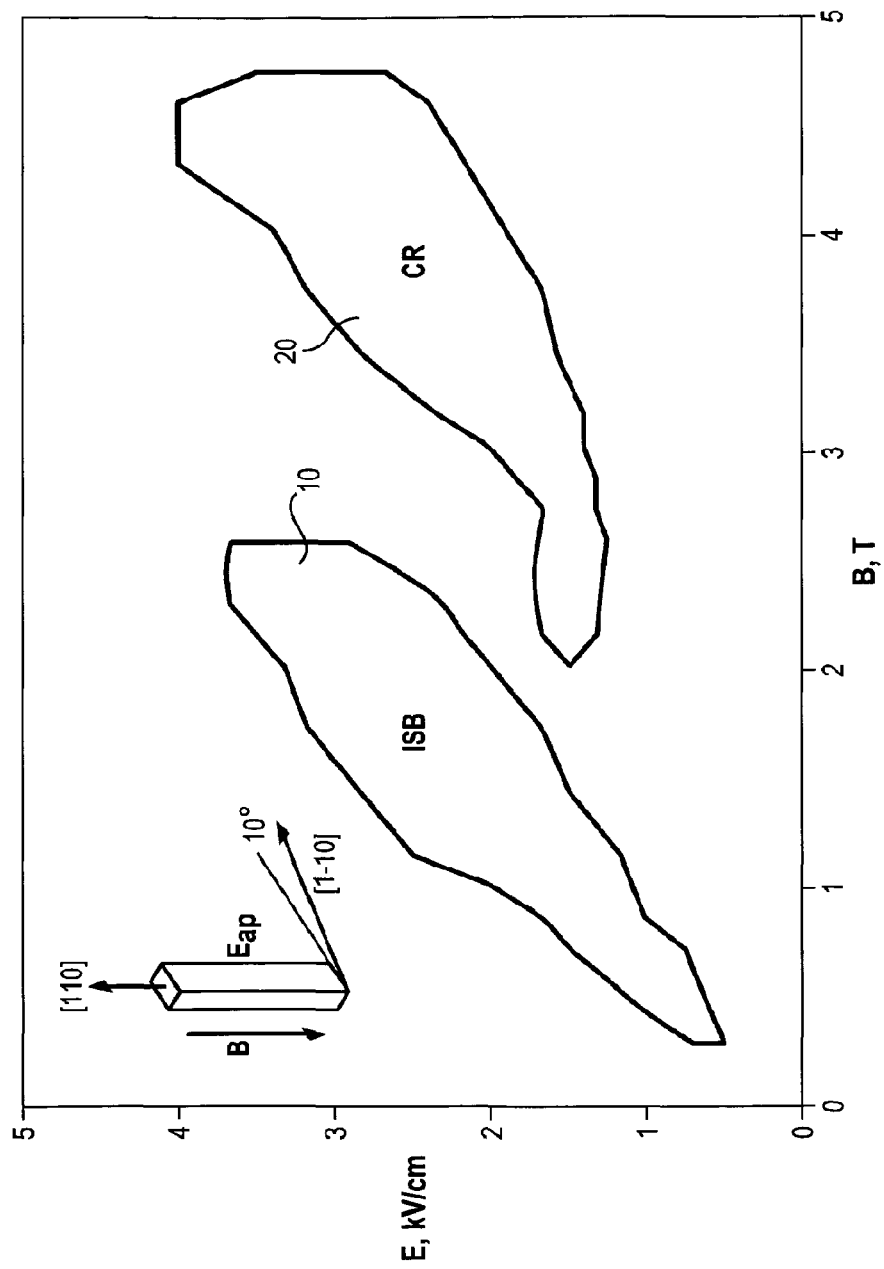
FIG. 3 illustrates fields of inter subband and cyclotron resonance radiation for given orientation of electrical E and magnetic B fields as a function of the values of electrical E and magnetic B fields.

The radiation regime CR becomes possible due to processes of diffusion and interaction with the valence subband of heavy holes which lead to inversion of the population and to non-equidistance between the Landau levels in the valence subband of light holes. The expert will appreciate that the strong anisotropy of the effective mass of the heavy holes influences the diffusion of holes from the valence subband of light holes towards the valence subband of heavy holes. The crystallographic orientation (relative to the electrical E and magnetic B fields) and the concentration of acceptors determine the ISB and CR radiation fields as a function of the values of applied electrical and magnetic fields. FIG. 3 illustrates the radiation fields ISB 10 and CR 20 as a function of the values of electrical E and magnetic B fields applied for a p-doped germanium crystal by using gallium acceptors (NGa=7·10$^{13}$, dimensions crystal=3×5×50 mm$^3$), the magnetic field being parallel to the crystalline axis [110] and the electrical field forming an angle of 10° with the crystalline axis [1-10].

The selected crystallographic orientation (i.e. B parallel to the crystalline axis [110] and E forming an angle of 10° with the crystalline axis [1-10]) produces emission of a light wave in the CR field. The frequency of the light wave is between 1.2 THz and 2.8 THz for magnetic field values B between 2 and 4.8 Teslas. At lower magnetic field values in opposite polarity, the p-Ge crystal generates a light wave in the ISB field.

In the CR field, the p-Ge 3 crystal generates a light wave having a line width of 6 GHZ (0.2 cm$^{-1}$). In the ISB field, the p-Ge 3 crystal generates a light wave having a power 10 times greater than that of the light wave emitted in the CR field.

However, the line width of the light wave emitted is also greater (300-600 GHz, or 10-20 cm$^{-1}$). The fact of being able to switch between the two radiation regimes therefore allows adaptation of the laser device to different applications.

Advantageously, the orientation of the applied electrical field $E_{ap}$ can be selected to consider the $E_H$ Hall field. For a given magnetic field between 2 and 4.5 Teslas and dimensions of crystal (for example 3×5(according to $E_{ap}$)×50(according to B) mm$^3$) the $E_H$ Hall field takes values of the same order of magnitude as the applied electrical field $E_{ap}$. This produces an electrical field resulting $E_{tot}=E_H+E_{ap}$ forming an angle between 40 and 55° relative to the crystalline axis [1-10]. For an electrical field applied equal to 20°, the resulting electrical field $E_{tot}=E_H+E_{ap}$ has an angle of 60 . . . 75° (or −20 . . . −35° according to the polarity of the magnetic field B) with the crystalline axis [1-10]. An electrical field $E_{ap}$ forming an angle with the crystalline axis [1-10] between 10 and 35° will preferably be selected.

As mentioned hereinabove, the concentration of doping agent also influences the diffusion process. To produce the two radiation regimes ISB and CR, a germanium crystal doped by gallium is used at a concentration of NA=7·10$^{13}$ cm$^{-3}$. The crystal has a parallelepipedic form measuring 3×6×50 mm$^3$ or 3×6×30 mm$^3$. The faces of the p-Ge 3 crystal are polished. This allows the crystal to generate a light wave. Two of the six faces of the p-Ge 3 crystal (faces measuring 3×50/3×30) are covered in a layer of indium In to boost the electrical conductivity of the crystal. The crystal is positioned such that its larger dimension extends according to the axis of the superconducting coil 4.

Connection Means

The electrical connection means 5 electrically connect the support element 2 and the superconducting coil 4 to one (or more) generator(s). For example, the superconducting coil 4 can be connected to a current generator and the support element 2 can be connected to a voltage generator by means of the connection means 5. These connection means 5 are arranged at a second end 121 of the waveguide 1. In reference to FIG. 1, the connection means 5 are arranged at the level of the free end 121 of the tube 12.

Figure 4:
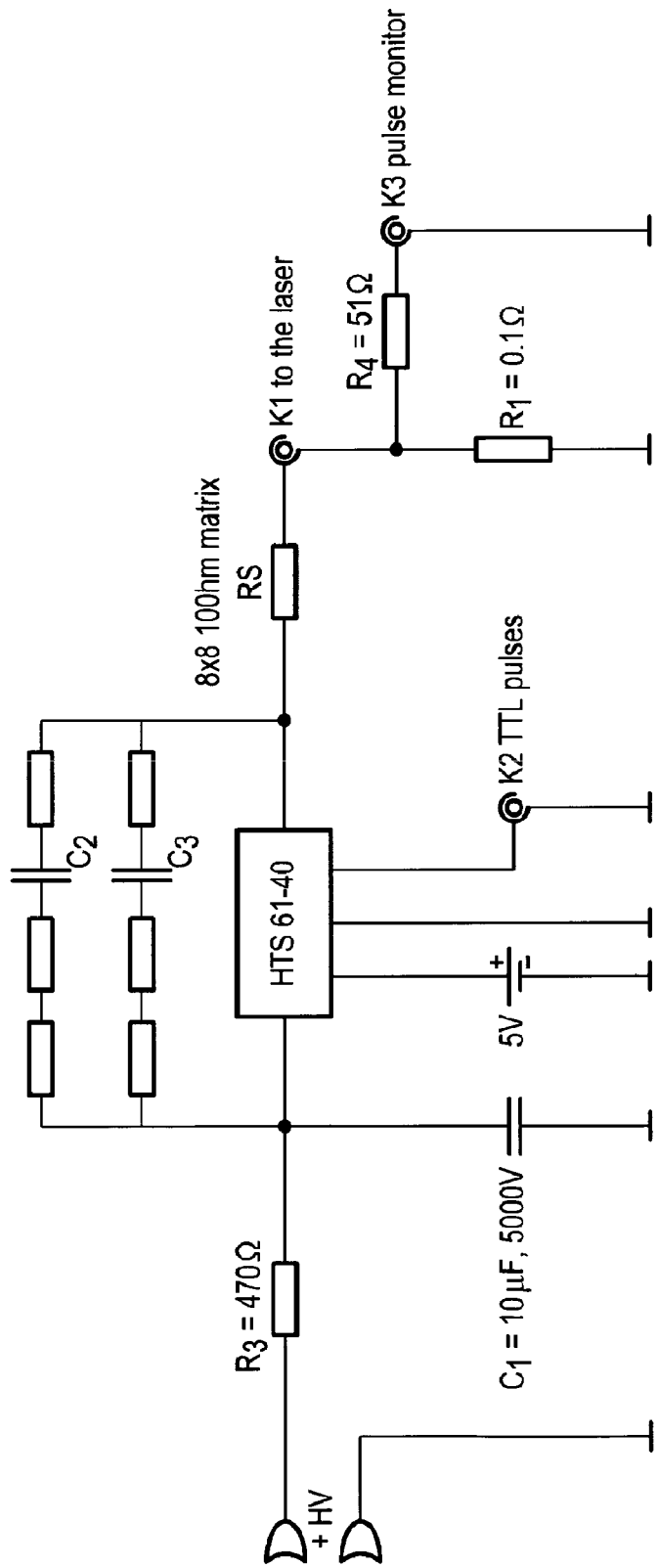
FIG. 4 schematically illustrates an example of a voltage generator for application of the electrical field E.

The generator or generators are preferably selected so as to enable generation of:
a magnetic field between 2 and 5 Teslas; for example, the choice is made to connect the superconducting coil 4 to a current generator capable of delivering an electrical current between 0 and 100 amperes (5 Teslas need approximately 35 amperes),
an electrical field between 2.5 and 4 kV/cm; for example, the choice is made to connect the p-Ge 3 crystal to a drawn voltage generator such as illustrated in FIG. 4.

Voltage Generator

In reference to FIG. 4, this illustrates an example of a drawn high-voltage generator which can be connected electrically to the support element 2 to generate an electrical field inside the p-Ge 3 crystal. This voltage generator is capable of generating short rectangular electrical pulses from 1 s to 2 s, between 0.5 kV and 2 kV, and of intensity between 50 A and 200 A.

The operating principle is the following. A high-voltage source is charged via a first resistor $R_3$ and a first condenser $C_1$. In short time intervals a logic circuit TTL (transistor-transistor logic) opens a switch or high-voltage rapid transistor (or "HTS" for the English expression "high transistor switches"), and the condenser $C_1$ is discharged via an output resistor Rs and the p-Ge crystal. As the impedance of the p-Ge crystal is non-linear, some of the electrical pulses are reflected towards the high-voltage rapid transistor. The output resistor Rs protects the high-voltage transistor from return pulses (known as "flyback pulse"). The condensers $C_2$, $C_3$ connected in series with resistors form a high-frequency filter which decreases the noise on the rising and falling fronts of the rectangular electrical pulses.

Resonator

The resonator 6 boosts (of the order of 3 to 5 times) the power of the light wave emitted by the p-Ge 3 crystal. The resonator 6 is arranged at the level of the support element 2. Different types of resonators 6 can be utilised.

In a variant embodiment, the resonator 6 is of Perrot-Fabry type. The resonator comprises two mirrors 61, 62 extending in planes perpendicular to the axis A-A' of the waveguide 1. These mirrors 61, 62 are positioned on either side of the p-Ge 3 crystal according to the axis A-A' of the waveguide 1 such that the p-Ge 3 crystal extends between the two mirrors 61, 62 forming the resonator 6.

The material comprising the mirrors 61, 62 of the resonator can be metallic, brass for example. In this case, a dielectrical film (not shown) such as a Mylar film can be arranged between the p-Ge 3 crystal and each metallic mirror 61, 62. This electrically insulates the mirrors 61, 62. In the embodiment illustrated in FIG. 1, each mirror 61, 62 is separated from the crystal by a distance of 10 μm according to the axis A-A' of the waveguide 1.

The material comprising the mirrors 61, 62 of the resonator 6 can also be silicon dioxide SiO2, or again high-purity germanium Ge. In these cases, the external faces (opposite the crystal) of the mirrors made of Ge or SiO2 are metallised. Because high-purity Ge and SiO2 are electrically insulating at low temperatures, the mirrors 61, 62 can be directly in contact with the p-Ge 3 crystal.

The mirror 62 closest to the waveguide 1 comprises a through opening 621 for passage of the light wave to the waveguide 1. In the embodiment illustrated in FIG. 1, the through opening 621 has a diameter of 1.5 mm. In an embodiment, the mirrors 61, 62 are plane. In another embodiment, the mirror 61 farthest from the waveguide 1 is spherical. This helps to optimise the composition of the light wave emitted by the p-Ge crystal in optical modes.

The mirror 62 the closest to the waveguide can be semi-transparent to limit the effects of diffraction likely to perturb the output laser beam. In a variant embodiment, the mirrors are formed directly on the faces of plates of crystal of high-purity germanium in contact with the p-Ge crystal. More precisely:

a first mirror is formed by deposit on the face of a germanium crystal in contact with the face of the p-Ge crystal the farthest from the waveguide, a second mirror is formed by deposit on the face of a germanium crystal in contact with the face of the p-Ge crystal closest to the waveguide.

The mirrors are formed on the faces of the germanium crystals opposite the faces in contact with the p-Ge crystal. These germanium crystals are positioned on the p-Ge crystal such that the mirrors extend perpendicularly to the axis A-A'.

The high-purity germanium is a good electrical insulator and protects the mirrors from high-voltage pulses generated to produce light radiation in the terahertz range. The use of mirrors formed on the external faces of germanium crystals optimises the output power and the optical quality of the output beam. In fact, there is no cavity between the reflecting surfaces of the mirrors and the crystal, decreasing losses associated with reflections occurring in such a cavity. The use of mirrors in either spherical or plane (plate) shape on the external faces of germanium crystals optimises the beam composition in optical modes.

Cooling Means

The laser device also comprises cooling means 7 containing coolant in the liquid state, such as liquid helium, the support element 2, the p-Ge 3 crystal and the superconducting coil 4, part of the waveguide 1 and the resonator 6. These cooling means 7 are advantageously a standard bottle of helium, for example a container RH 65 of Liquid Air®. In fact, the form and dimensions of the support element 2, superconducting coil 4 and p-Ge 3 crystal produce a laser device sufficiently small for the latter to be introduced to a standard bottle of helium.

This produces a portable laser device. It is evident that the electrically conductive connection means 5 extend to the exterior of the bottle of helium.

So, although the assembly comprising the p-Ge 3 crystal, the support element 2, the resonator 6 and the coil 4 is fully contained within the bottle of helium, part of the waveguide 1 extends to the exterior of the bottle of helium, such that the quantity of helium in the waveguide 1 can vary between its proximal and distal ends. With the refraction index of the helium varying as a function of parameters such as pressure or density, the variation in quantity of helium along the waveguide 1 causes variation of the refraction index of the latter along said waveguide 1. This variation of the refraction index can cause perturbations such as variations in power and/or direction of the light beam through the waveguide 1.

As mentioned hereinabove, the distal end of the waveguide 1 can comprise a window 13 transparent to terahertz waves for homogenising the quantity of helium inside the waveguide 11 to avoid these perturbations. As a variant, the proximal and distal ends of the waveguide can each comprise a transparent window respective so as to form an airtight waveguide, the waveguide being in a vacuum or containing coolant in gaseous phase.

Optical System

Figure 5:
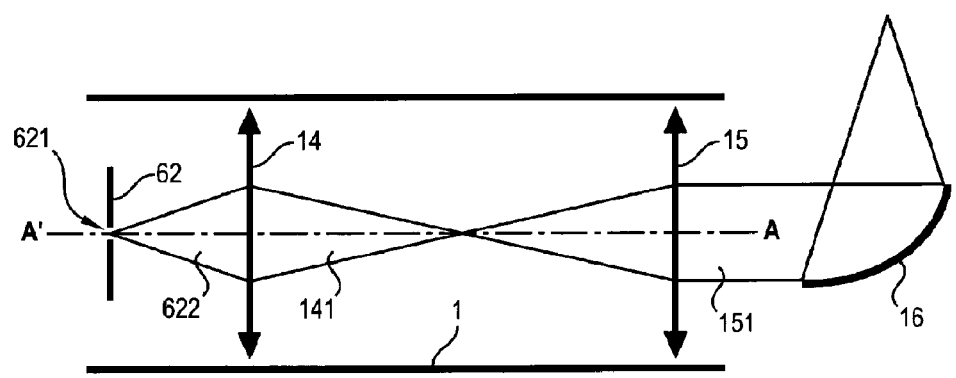
FIG. 5 schematically illustrates an example of an optical system.

The waveguide 1 can comprise an optical system. This optical system enables collimation of the light wave emitted by the p-Ge 3 crystal. Advantageously, the light beam collimated by the optical system can be vertical or horizontal. The optical system can comprise one (or more) lens or lenses and/or one (or more) mirror(s). In a variant embodiment illustrated in FIG. 5, the optical system comprises two convergent lenses 14, 15 and a parabolic mirror 16. The parabolic mirror 16 is positioned at the output of the waveguide 1 and orients the light beam originating from the waveguide 1 perpendicularly to the axis A-A' of the waveguide.

A first lens 15 is positioned at the second end 121 of the waveguide 1 (i.e. the end farthest from the resonator/support element/coil assembly). The first lens 15 is selected such that the light beams 151 exiting from this first lens 15 are parallel. This first lens 15 insulates the waveguide from the outside air so as to homogenise the level of helium inside the waveguide 1. This first lens 15 can therefore replace the window 13 transparent to terahertz waves.

A second lens 14 is positioned in the waveguide 1. The distance between the resonator 6 and the second lens 14 (i.e. the closest to the resonator/support element/coil assembly) is selected such that:

said lens 14 is the farthest possible from the resonator 6, and the light beam 622 originating from the resonator 6 does not come into contact with the internal walls of the waveguide 1.

For example, the second lens 14 is positioned in the waveguide 1 at a distance of 100 mm from the resonator 6. The focal distance of the second lens 14 is also selected such that the light beams 141 exiting from this second lens 14 do not come into contact with the walls of the waveguide 1 before they reach the first lens 15. This improves the quality of the output laser beam.

Operating Principle

The operating principle of the laser device described hereinabove is the following. The voltage generator supplies the electrical connections of the support element 2 so as to generate an electrical field E. The current generator supplies the superconducting coil 4 so as to generate a magnetic field B. More of the light waves emitted by the p-Ge 3 crystal pass through the mirror 62 of the resonator 6 the closest to the waveguide 1 at the level of the through opening 621 of the latter. These light waves propagate in the waveguide 1 and enter into contact with the second lens 14 of the optical system. The second lens 14 focuses the light waves in the waveguide 1 so as to prevent the light waves coming into contact with the walls of the waveguide 1. The focused light waves propagate as far as the first lens 15 of the optical system and pass through the latter. The light waves 151 exiting from the first lens 15 are parallel. The parallel light waves 151 propagate as far as the parabolic mirror 16 which orients these light waves perpendicularly to the axis A-A' of the waveguide 1.

The reader will appreciate that numerous modifications can be made to the invention such as described hereinabove without departing materially from the ideas of the present document. As a consequence, all these modifications are intended to be incorporated within the reach of the attached claims.

The invention claimed is:

1. A laser device for emission of waves in a frequency range in the terahertz range, the laser device comprising:
    a waveguide extending longitudinally according to an axis A-A', the waveguide comprising a proximal end and a distal end;
    a superconducting coil coaxial to the waveguide and arranged at the level of the proximal end of the waveguide;
    a p-Ge crystal of p-doped germanium arranged inside the coil such that the windings of the superconducting coil at least partially enclose the p-Ge crystal;
    cooling means containing coolant in the liquid state, the superconducting coil and the p-Ge crystal being arranged in the cooling means and the waveguide extending partially to the exterior of the cooling means;
    means for eliminating coolant in the liquid state in the waveguide, the means comprising two windows transparent to light radiation in the terahertz range at the level of the proximal and distal ends of the waveguide.

2. The device as claimed in claim 1, wherein the means for eliminating coolant in the liquid state in the waveguide replace it with coolant in the gaseous state.

3. The laser device as claimed in claim 2, wherein the means for eliminating coolant in the liquid state in the waveguide also comprise a heating element in thermal contact with the waveguide to prevent coolant condensation.

4. The device as claimed in claim 1, wherein the means for eliminating coolant in the liquid state in the waveguide comprise a vacuum made in the waveguide.

5. The device as claimed in claim 1, wherein the windows are made of transparent material in the terahertz range including at least one of: crystalline quartz, Mylar, Teflon®, ZnSe crystalline, sapphire, high-purity silicon or other high-purity semiconductors crystals.

6. The device as claimed in claim 1, wherein the window transparent to the light radiation positioned at the level of the distal end of the waveguide is a lens.

7. The device as claimed in claim 1, further comprising a resonator comprising at least two mirrors deposited onto two respective plates of crystal of high-purity germanium in contact with the p-Ge crystal, the p-Ge crystal being arranged between the plates of crystal germanium according to the axis A-A' of the waveguide.

8. The device as claimed in claim 7, wherein the mirrors are made of material selected from silicon dioxide SiO2 and high-purity germanium.

9. The device as claimed in claim 7, wherein the mirror located the farthest from the waveguide is spherical.

10. The device as claimed in claim 7, further comprising a convergent lens arranged inside the waveguide such that the distance between the lens and the resonator is the greatest possible, and the light beam originating from the resonator does not come into contact with the internal walls of the waveguide.

11. The device as claimed in claim 10, wherein the focal distance of the convergent lens is selected such that the light beams exiting from the convergent lens do not come into contact with the walls of the waveguide.

12. The device as claimed in claim 1, wherein the waveguide comprises a divergent cone trunk and a tube coaxial to the divergent cone trunk, the tube extending at the level of the large base of the cone trunk, the small base of the divergent cone trunk forming the first end of the waveguide.

13. The device as claimed in claim 1, wherein the superconducting coil comprises at least two layers of windings, each winding of a new layer being positioned in a hollow formed by two adjacent windings of the preceding layer.

14. A laser device for emission of waves in a frequency range in the terahertz range, the laser device comprising:
    a waveguide;
    a superconducting coil coaxial to the waveguide and arranged at a proximal end of the waveguide;
    a p-Ge crystal of p-doped germanium arranged inside the coil such that the windings of the superconducting coil at least partially enclose the p-Ge crystal;
    a container holding a coolant in the liquid state, the superconducting coil and the p-Ge crystal being arranged at least partially in the container and the waveguide extending partially to the exterior of the container; and
    a heater substantially eliminating the coolant in the liquid state in the waveguide, and windows transparent to light radiation in the terahertz range at the level of the proximal end of the waveguide.

15. The device as claimed in claim 14, further comprising a resonator comprising at least two mirrors deposited onto two respective plates of crystal of high-purity germanium in contact with the p-Ge crystal, the p-Ge crystal being arranged between the plates of crystal germanium.

16. The device as claimed in claim 15, wherein the mirrors are made of at least one of the following materials: silicon dioxide SiO2 or high-purity germanium.

17. The device as claimed in claim 15, wherein the mirror located the farthest from the waveguide is spherical.

18. The device as claimed in claim 15, further comprising a convergent lens arranged inside the waveguide and a light beam originating from the resonator does not come into contact with internal walls of the waveguide.

19. The device as claimed in claim 14, wherein the waveguide comprises a divergent cone trunk and a tube coaxial to the divergent cone trunk, the tube extending at a level of the large base of the cone trunk, and the small base of the divergent cone trunk forming an end of the waveguide.

20. The device as claimed in claim 14, wherein the superconducting coil comprises at least two layers of windings, each winding of a new layer being positioned in a hollow formed by two adjacent windings of the preceding layer.

* * * * *